(12) United States Patent
Chung

(10) Patent No.: US 6,409,859 B1
(45) Date of Patent: *Jun. 25, 2002

(54) METHOD OF MAKING A LAMINATED ADHESIVE LID, AS FOR AN ELECTRONIC DEVICE

(75) Inventor: Kevin Kwong-Tai Chung, Princeton Township, NJ (US)

(73) Assignee: Amerasia International Technology, Inc., Princeton Junction, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,453

(22) Filed: Jun. 21, 1999

Related U.S. Application Data

(60) Provisional application No. 60/091,333, filed on Jun. 30, 1998.

(51) Int. Cl.$^7$ .............................................. B32B 31/18
(52) U.S. Cl. ...................... 156/69; 156/250; 156/292; 264/153
(58) Field of Search .............................. 264/153, 297.6; 156/528, 522, 526, 307.5, 69, 292, 250; 438/119, 118; 257/704; 436/4

(56) References Cited

U.S. PATENT DOCUMENTS

| | | |
|---|---|---|
| 2,014,524 A | 9/1935 | Franz |
| 2,774,747 A | 12/1956 | Wolfson et al. |
| 3,401,126 A | 9/1968 | Miller et al. |
| 3,429,040 A | 2/1969 | Miller |
| 3,538,597 A * | 11/1970 | Leinkram et al. ............ 228/164 |
| 4,012,832 A * | 3/1977 | Crane .......................... 29/575 |
| 4,113,981 A | 9/1978 | Fujita et al. |
| 4,442,966 A | 4/1984 | Jourdain et al. |
| 4,844,852 A * | 7/1989 | Keyser et al. ............... 264/153 |
| 5,041,396 A * | 8/1991 | Valero .......................... 437/209 |

(List continued on next page.)

OTHER PUBLICATIONS

P. Scharf, T. Coleman and K. Avellar, "Flip Component Technology", IEEE Electronic Component Conference (1967), pp. 269–274.

Gilleo, K: "Direct Chip Interconnect Using Polymer Bonding", IEEE 39th Electronic Component Conference, May 1989, pp37–44.

R. Lachance, H. Lavoie, A Montanari, "Corrosion/Migration Study of Flip Chip Underfill and Ceramic Overcoating", IEEE Electronic Components and Technology Conference (1997), pp. 885–889.

(List continued on next page.)

*Primary Examiner*—Michael W. Ball
*Assistant Examiner*—Gladys Piazza
(74) *Attorney, Agent, or Firm*—Dann, Dorfman, Herrell & Skillman, P.C.

(57) ABSTRACT

An electronic package or module is protected by a lid sealed with a thermoplastic or thermosetting adhesive laminate that has been pre-applied onto the lid, including the bonding area of the lid. The adhesive is deposited as wet adhesive or is laminated in sheet format onto a sheet of the material of which the lids are to be formed. The adhesive is dried or B-staged to become a solid sheet preform, as by solvent removal or chemical cross-linking, respectively. The lids are then formed from the laminate of lid material and adhesive, as by thermo-forming or by stamping. The lid and adhesive materials may be electrically insulating, or may be electrically conductive so as to replace soldered lids in providing electromagnetic interference protection. In some cases, the adhesive may be thermally conductive and be utilized in combination with thermally conductive interface material that is in direct contact with heat generating devices covered by the lid. In all of these cases, lid attachment includes adhesive bonding at a temperature substantially lower than the typical temperature at which solder melts.

29 Claims, 4 Drawing Sheets

U.S. PATENT DOCUMENTS

| | | | |
|---|---|---|---|
| 5,046,415 A | | 9/1991 | Oates |
| 5,056,296 A | | 10/1991 | Ross et al. |
| 5,074,947 A | | 12/1991 | Estes et al. |
| 5,196,371 A | | 3/1993 | Kulesza et al. |
| 5,237,130 A | | 8/1993 | Kulesza et al. |
| 5,268,048 A | * | 12/1993 | Leibovitz et al. ............. 156/94 |
| 5,272,800 A | * | 12/1993 | Rooney et al. ............... 29/428 |
| 5,539,153 A | | 7/1996 | Schwiebert et al. |
| 5,572,070 A | * | 11/1996 | Ross .......................... 257/713 |
| 5,611,140 A | | 3/1997 | Kulesza et al. |
| 5,635,672 A | * | 6/1997 | Kawaura ................... 174/52.3 |
| 5,667,884 A | | 9/1997 | Bolger |
| 5,672,548 A | * | 9/1997 | Culnane et al. ............. 437/209 |
| 5,847,929 A | * | 12/1998 | Bernier et al. .............. 361/719 |

OTHER PUBLICATIONS

T.Y. Wu, Y. Tsukada, W.T. Chen, "Materials and Mechanics Issues in Flip–Chip Organic Packaging", IEEE Electronic Components and Technology Conference (1996), pp. 524–534.

B. Rösner, J. Liu, Z. Lai, "Flip Chip Bonding Using Isotopically Conductive Adhesives", Electronic Components and Technology Conference, (1996) pp. 578–581.

D. Gamota, C. Melton, "Advance Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997, pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductive Adhesive as Solder Replacement in Flip Chip Interconnection", Proceedings Semicon West 1998, Jul. 1998, pp. 1–14.

"Cost Effective Solutions for Advanced Semiconductor Interconnection and Packaging", AI Technology, Inc., Jul. 1998.

Product Catalog No. c/091593R, Robinson Electronics Inc, "Molded Hybrid Covers and Lids".

Proposal #N88–198, "Hermetic Packaging Equivalent", AI Technology, Jan. 1988, pp. 1–22 (Redacted).

* cited by examiner

METHOD OF MAKING A LAMINATED ADHESIVE LID, AS FOR AN ELECTRONIC DEVICE

This Application claims the benefit of U.S. Provisional Application Serial No. 60/091,333 filed Jun. 30, 1998.

The present invention relates to lids and, in particular, to lids formed from laminates of adhesive and lid material.

There are many approaches to packaging electronic devices and other goods for protection against such hazards as handling, mechanical damage, environmental exposure, chemical attack, and other potentially adverse elements. As a result of both functional and aesthetic requirements, these devices are typically encased in several levels of packaging. The outermost level is most likely the housing or enclosure of the apparatus in which such devices are employed, such as a computer case, TV receiver enclosure, cellular telephone housing and the like.

Generally, electronics devices at the electrical component level, such as microprocessors and other semiconductor devices, are packaged with a first level of protection in the form of a metal or ceramic package or by a solid organic encapsulation. Besides the traditional "Dual-In-Line" package in which an electronic component mounted to a lead frame is molded within an epoxy compound, the equivalent may be created by applying a glob of liquid plastic epoxy to form the so-called "glob-top" encapsulation. See, e.g., T. Gabrykewioz, et al,. "Glob-Top Material Selection for Flip Chip Devices", *Proceedings of the* 1986 *International Symposium on Microelectronics*, 1986, pages 107 et seq., and Paul Collander, et al., "Humidity Testing of Plastic Coated Integrated Test Circuits", *Proceedings of* 1987 *International Symposium on Microelectronics*, 1987, pages 249 et seq. However, because of substantial differences in the coefficients of thermal expansion between the substrate or device and the encapsulant, substantial peel stress occurs in a coated structure (rather than compressive stress as occurs in a molded structure) which limits the long-term reliability of such devices, as reported by R. Schwartz, "Microelectronic Packaging: 11", *Journal of the American Ceramic Society*, 63(4). 1984, pages 577–581. In some cases, an electronic semiconductor device may not be able to be encapsulated by a solid encapsulant because of the adverse effects of stress induced in the device by direct contact with the encapsulant. In other cases, the cost of the encapsulation material and/or its application may be too costly. It is interesting to note that in detailed testing of actual devices, packaged devices that allowed reasonable flow or "breathing" of moisture into and out of the packages proved to be more reliable than those molded devices that sought to exclude such moisture penetration, as reported by E. B. Hakim in the "US Army Panama Field Test of Plastic Encapsulated Devices", AD-A048 413, July 1977.

When several packaged electronic devices have been assembled into a functional unit, such as a printed wiring circuit board or other electronic substrate, they are then protected by an exterior lid or cover of the functional unit that forms a housing therefor. These lids or covers may be attached to the functional unit with adhesive, solder, screws or other mechanical fasteners.

Certain electronic devices may need a thermal connection to transfer heat away from the device, which need cannot be satisfied by an encapsulant or molding compound. A thermally-conductive metal lid attached with adhesives that also serve as a thermal interface with the device inside the package or laced with another thermally-conductive media between the lid and the heat generating device have been employed to provide such thermal connection, however, the conventional application of such techniques has been imprecise and so the effectiveness and conductivity of the thermal connection may be uncertain.

Certain other cases may need the lid or cover to be electrically conductive and connected to the electrical ground of the finished device to provide attenuation of electromagnetic interference (EMI) to and from other devices. This requirement cannot be easily met with an insulating organic encapsulant and soldering may be inconvenient or undesirable because of the effect of the soldering temperature on electronic devices that are attached by soldering. In reworking or repairing a device employing soldered covers, de-soldering the cover may also cause damage to or de-soldering of the covered electronic devices.

In fact, most electronic devices used in military, space and other high reliability applications employ a hermetic-seal package to prevent moisture and other contaminants and adverse elements from affecting the electronic devices enclosed thereby. However, hermetic packages are very expensive to implement. In addition, either soldered or brazed metal packages or housings are usually employed in military and space applications requiring an electrically-conductive package or housing for EMI protection. In order to prevent damage to the electronic devices mounted in such hermetic package by the generally high processing temperatures necessary for soldering or brazing, each package has to be selectively heated only in the local area at the package rim to which the lid is soldered or brazed. Thus the processing time and work required to attach the protective lid is high, and therefore costly.

In addition, both the sealing material and the lid material of hermetic devices must be selected from materials having coefficients of thermal expansion (CTE) that substantially match the CTE of the electronic package and of the electronic device mounted therein. This requirement of matching the respective CTE of the board substrate to that of the sealing materials, and to that of the lids also increases the cost of the finished devices. In general, the cost of both the materials meeting these requirements and processing they require are prohibitive for general application commercial electronics.

Lids and covers are used to a certain extent in commercial electronics, for example, where special requirements exist. One such requirement applies to frequency selective electronic devices that are susceptible to stress-induced frequency distortion, such as certain oscillators, crystals, oscillators, acoustic wave filters and other like devices employed in communication equipment. Lids for such devices are generally attached by an adhesive in the form of dispensable paste or die-cut preforms that may be applied to the lid shortly before the lid attachment bonding process. Where the volume of production is high, for example, lids are pre-coated with adhesive or have adhesive preforms pre-applied, and the adhesives employed are those that will flow and cure when heated and applied under pressure during the lid attachment process.

However, the cost of pre-coating adhesives and of pre-application of adhesive preforms onto lids or covers by conventional methods is still quite high. Typically, adhesives in liquidous form are dispensed with a programmable automatic dispenser or are roller-coated onto the sealing areas of each lid. The adhesive is subsequently dried or B-staged at a temperature and for a time substantially less than the curing temperature and time of the adhesive. The liquidous adhesive thus becomes solid state adhesive on each lid either through solvent evaporation or through chemical cross-linking, or both, during what is generically termed as "B-staging." For example, in U.S. Pat. No. 5,667,884 entitled "Area Bonding Conductive Adhesive Preforms" issued to J. C. Bolger, Example VII thereof describes stamping and cutting copper strip into individual square domed covers, cutting tape adhesive into individual squares slightly larger than the individual covers, and tacking the individual adhesive squares to the individual copper cover squares. These tacked covers are pre-heated and then joined to a pre-heated semiconductor die attached to a preform in a clamshell heating fixture.

Thus, there is a need for an efficient method of pre-coating and pre-application of adhesive onto lids and covers to provide a cost-effective solution in protecting sensitive devices such as electronic devices. It may also be desirable that the adhesive attaching the lids be removable at a temperature and with a force low enough that neither the electronic substrate nor the electronic elements under the lid be damaged thereby, for example, at a temperature less than the melting temperature of solder.

There is also a need for attachment of EMI-shielding lids or covers at a temperature lower than the melting temperature of solder. This will be even more useful it the adhesive that attaches the lid or cover is electrically conductive and bonds instantly upon reaching a bonding temperature that is substantially below the general melting temperature of solder, or about 220° C.

With the advancing of semiconductor technology to produce more powerful microprocessors and other semiconductor components that generate substantial heat, there is also a need for a cost-effective lid attachment that also serves as thermal spreader to facilitate removal of such heat.

To this end, the method of making a plurality of laminated lids of the present invention comprises:

laminating a sheet of lid material and an adhesive; and stamping the plurality of laminated lids out of the laminated sheet of lid material and adhesive.

According to another aspect of the present invention, a method of contemporaneously making a plurality of lids having an adhesive laminated thereto comprises:

obtaining a sheet of lid material;

depositing a layer of adhesive on the sheet of lid material to form a laminated sheet of lid material and adhesive;

locating the laminated sheet between a pair of tooling plates, one tooling plate having a plurality of recesses therein at positions at which respective ones of the plurality of lids are to be formed, and the other tooling plate having a plurality of projections therefrom in positions corresponding to the recesses in the first tooling plate;

forming the plurality of lids in the laminated sheet by moving the tooling plates together to place the projections of the second tooling plate into the recesses of the first tooling plate, whereby the laminated sheet is formed into the recesses by the projections; and cutting the plurality of formed lids from the formed laminate sheet.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

The present invention relates to lids for protecting devices such as electronic components and modules wherein the lids are formed from a laminate including a lid material and a pre-coated adhesive sheet or preforms. Exemplary adhesives employed include B-stageable epoxy or thermoplastic or thermosetting adhesives that, for certain applications, may be filled with specific particulates for rendering the adhesive electrically and/or thermally conductive or for reduction of the coefficient of thermal expansion thereof.

Lids having pre-applied adhesive preforms, whether or not having other specific particulate fillers, are formed by an method including deposition of wet adhesive onto a substrate of lid material followed by forming and cutting of a plurality of individual lids therefrom. The sheet of lid material and adhesive is of any convenient size from which a plurality of lids are produced. Areas within any one or more lids may have deposited therein by similar method adhesives with thermally-conductive, electrically-conductive, or dielectric particulate filler material. These applications of adhesive material onto the substrate of lid material may be in a repeating pattern within a larger panel of laminate that is positioned in known predetermined spatial relationship with two or more relational alignment holes for precisely positioning the adhesively-laminated lid material for stamping, thermo-forming and cutting out of individual lids. Lids with adhesive preforms attached may be packaged similarly to electrical components after the wet adhesive preforms are dried and B-staged to a solid state, and may be packaged either before or after the individual lids are formed and cut out.

Figure 1:
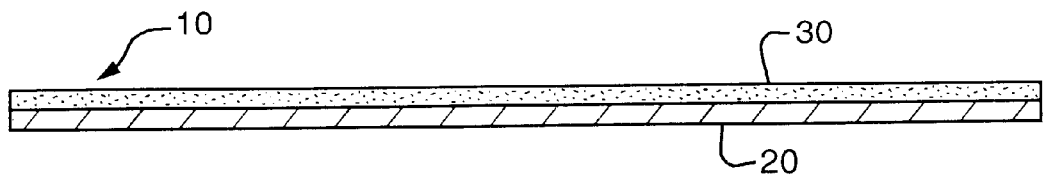
FIG. 1 is a cross-sectional view of an exemplary laminate of lid material and adhesive before lids are formed.

In FIG. 1, a cross-sectional view of an exemplary laminate 10 of lid material and adhesive before lids are formed, a sheet of lid material 20 is obtained and a thin layer of wet adhesive 30 is deposited thereon. The lid material 20 may be an insulating material, such as a thermo-formable plastic, liquid crystal polymer, polyester, poly-ether sulfone, or polyphenylene sulfide, or may be a metal such as copper, aluminum, brass, steel, stainless steel or alloys thereof, and combinations thereof. Lid materials 20 having a thickness of between about 2 mils and 50 mils are preferred, but thicker or thinner materials may be employed. Adhesive 30, which may be a thermoplastic or thermosetting adhesive, is deposited on the sheet of lid material 20 at a particular thickness by roll or drum coating, stenciling, mesh-, contact- or other screening, ink-jet or other printing, sheet laminating or other suitable means. Adhesive 30 is dried or B-staged to a tack-free solid form, preferably by heating to a temperature less than its melt-flow or bonding temperature, and typically has a particular dry thickness that is in the range between about 25 and 500 microns, but thicker or thinner layers may be employed. Laminated sheets 10 of lid material 20 and dried/B-staged adhesive 30 are used to form a plurality of lids or may be stored for an extended period before being so used.

Figure 2:
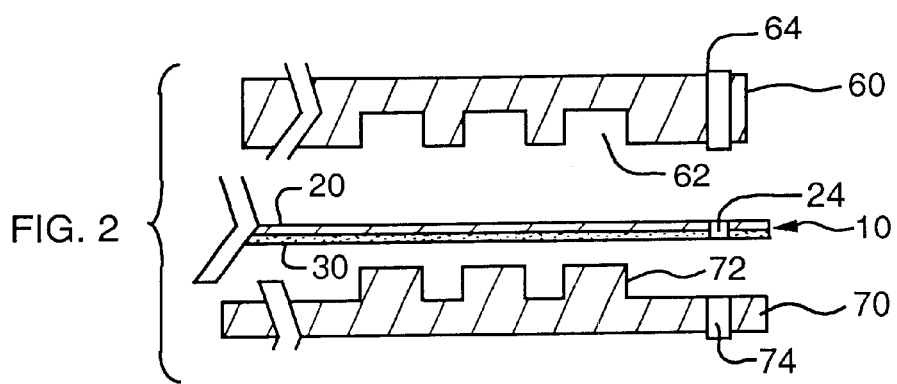
FIG. 2 is a cross-sectional view of the laminate of FIG. 1 between a set of complementary tooling plates for forming lids.

FIG. 2 is a cross-sectional view of the laminate 10 of FIG. 1 positioned between a set of complementary tooling plates 60, 70 for forming a plurality of lids 50 of the exemplary sort shown in FIG. 2. Lids 50 are formed from the laminated sheet 10 of lid material 20 and dried adhesive 30 by shaping the laminated sheet 10 in the plurality of locations at which lids 50 are to be formed. Such shaping may be performed by pressing laminated sheet 10 between a matched set of complementary tooling plates 60,70. A first tooling plate 60 having a pattern of a plurality of shaped recesses 62 therein bears against the lid-material 20 surface of laminated sheet 10 and a second tooling plate 70 having a corresponding pattern of a plurality of shaped projections 72 extending therefrom that are mirror images of the shaped recesses 62 in the first tooling plate 60 bears against the dried-adhesive 30 surface of laminated sheet 10. When tooling plates 60 and 70 are moved toward one another, the moving together thereof moves the shaped projections 72 into the shaped recesses 62 pressing the laminated sheet 10 into the shaped recesses and thereby forming laminated sheet 10 into the shape of the projections 72 and recesses 63 which define the shape of the lids 50. Thus, preferably, all of the plurality of lids 50 are formed contemporaneously, i.e. at substantially the same time.

In a stamping or embossing operation, the first and second tooling plates 60. 70 deform or emboss laminated sheet 10 by mechanical deformation of lid material 20 beyond its yield point, as would be employed with a metal lid material 20. Laminated sheet 10 yields to and retains its deformed shape defined by the recesses 62 and projections 72 of the first and second tooling plates 60, 70, respectively, In a thermo-forming operation, the first and second tooling plates 60, 70 are heated to a temperature above the thermo-forming temperature of a thermo-formable lid material 20 and form laminated sheet 10 by mechanically deforming thermo-formable lid material 20 and cooling it so that it retains the formed shape defined by the corresponding recesses 62 and projections 72 of the first and second tooling plates 60, 70, respectively.

A cutting die having a pattern of a plurality of cutting edges corresponding to the pattern of the plurality of lids 50 formed by the patterns of recesses 62 and projections 72 of tooling plates 60, 70, respectively, is applied to the formed laminate sheet 10 to cut out each of the plurality of lids 50 formed therein. This die-cutting operation of lids 50 may be performed as an operation separate from the forming operation described in the preceding paragraph, or the pattern of cutting edges may be formed in the tooling plates 60, 70 in which case the forming and cutting operations are performed contemporaneously. In addition and preferably, all of the plurality of lids 50 are cut out of the laminated sheet 10 contemporaneously.

Figure 3:
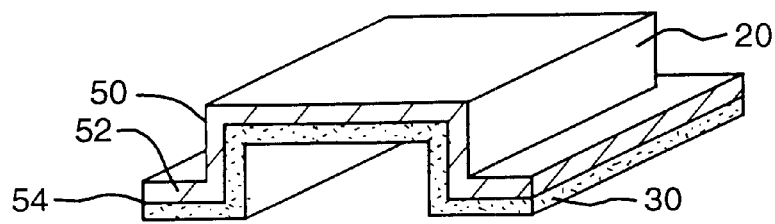
FIG. 3 is a cross-sectional view of one of the exemplary lids formed from the laminate of FIG. 1 and the tooling plates of FIG. 2.

FIG. 3 is a cross-sectional view of one of the exemplary lids 50 formed from the laminate sheet 10 of FIG. 1 by the forming and cutting operations described above. Formed lid 50 has an outer layer formed of the lid material 20 and is coated on the interior surface by the layer of adhesive material 30. Adhesive layer 30 covers a bonding edge 52 formed around the periphery of the open end of lid 50, which bonding edge 52 and adhesive area 54 are to be used to form a bond between formed lid 50 and the object to which it is attached, such as an electronic circuit substrate. It is noted that the adhesive area 54 is obtained from the portion of adhesive layer 30 that is coated on the area of lid material 20 that becomes bonding edge 52 without the need for any particular application of adhesive.

As a result, formed lids 50 and the method described above for producing formed lids 50 have great advantage in that a multiplicity of lids 50 having excellent uniformity may be produced in a mass-production operation at low cost. This method eliminates the handling of individual lids and the application of individual adhesive preforms onto individual lids or the dispensing of adhesive onto individual lids, as in the prior art. Moreover, the adhesive on lids 50 is in solid form and tack free, thereby simplifying the handling of formed lids 50.

Figure 4:
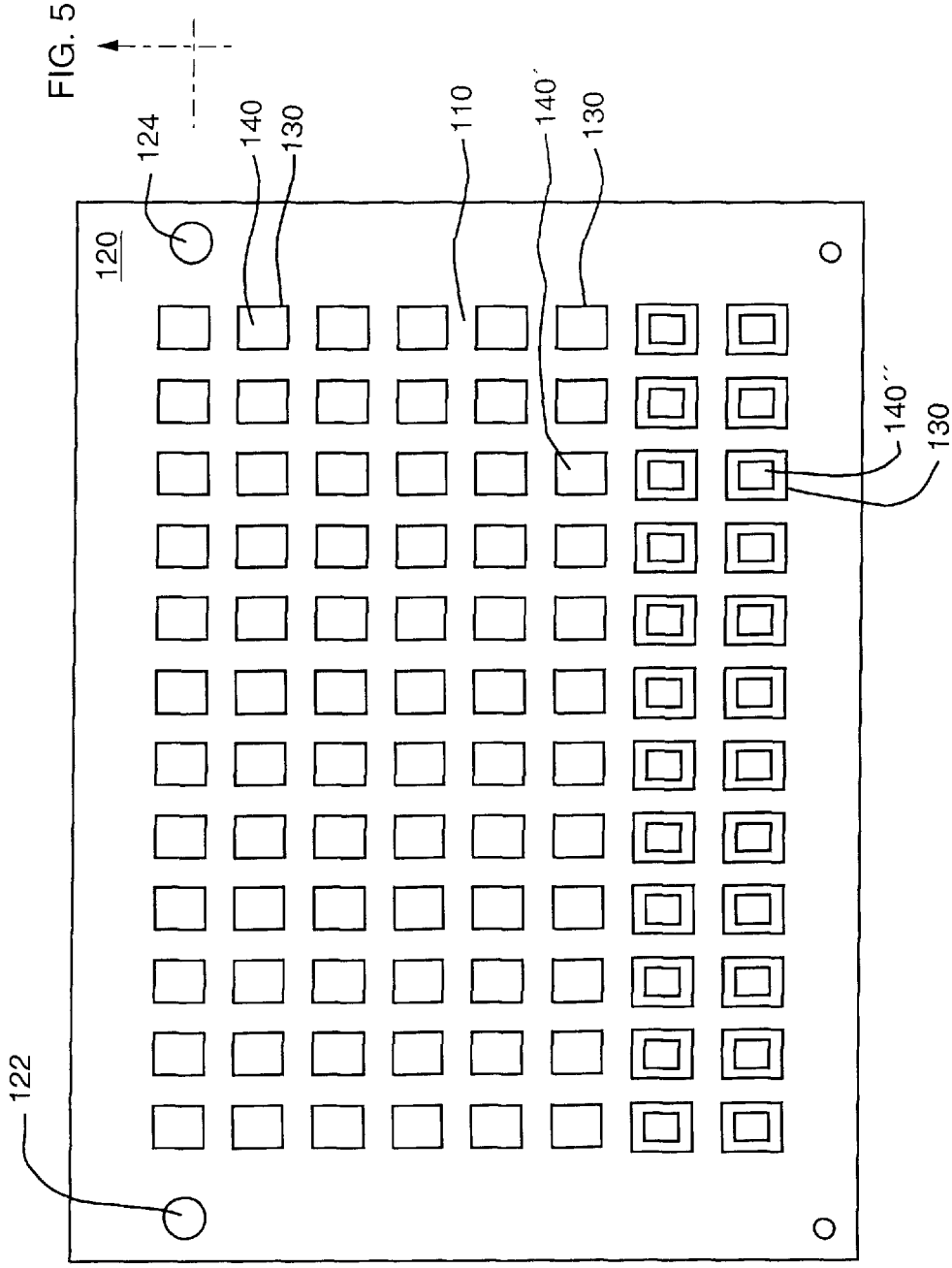
FIG. 4 is a plan view of an exemplary laminate of lid material with areas of adhesive and interface material thereon.

FIG. 4 is a plan view of an exemplary laminate 110 of a substrate of lid material 120 with areas of adhesive 130 and interface material 140 thereon. A sheet of lid material 120 is obtained and a pattern of wet adhesive 130 is deposited thereon. The lid material 120 may be an insulating material, such as a thermo-formable plastic, liquid crystal polymer, polyester, poly-ether sulfone, or polyphenylene sulfide, or may be a metal such as copper, aluminum, brass. Lid materials 120 typically having a thickness of between about 2 mils and 50 mils are preferred. A pattern of adhesive 130, which may be a thermoplastic or thermosetting adhesive, is deposited on the sheet of lid material 120 at a particular thickness by mesh-, contact- or other screening, ink-jet or other printing, laminating an adhesive sheet from a release substrate, or other suitable means. The pattern thereof includes a plurality of deposits of adhesive 130 in a shape corresponding to the shape of the bonding edge 152 of the lids 150 to be formed therefrom, such as a rectangular line shape 130 as illustrated in FIG. 4. Adhesive 130 is dried or B-staged to a tack-free solid form, preferably by heating to a temperature less than its melt-flow or bonding temperature, and typically has a particular dry thickness that is in the range between about 25 and 500 microns. Laminated sheets 110 of lid material 120 and dried/B-staged adhesive 130 are used to form a plurality of lids by the forming, stamping and cutting operations as described above in relation to FIGS. 2 and 3, or may be stored for extended periods before being so used, e.g., for twelve months or more.

Because the pattern of shaped deposits of adhesive 130 must be located in a particular position with respect to the tooling plates that are employed to form and cut the lids 150 that are produced from laminate sheet 110, it is preferred that at least two relational alignment holes be employed. The pattern of deposited adhesive 130 is positioned in known predetermined spatial relationship with the two or more relational alignment holes 122, 124 for precisely positioning the lid material 120 first for positioning the screen or mask by which the pattern of adhesive 130 is deposited thereon and then for positioning the lid material and adhesive laminate 110 for stamping, thermo-forming and cutting out of individual lids. The screen or mask, the tooling plates, or both, preferably employ corresponding relational alignment holes therein that are in the same known predetermined spatial relationship as are the pattern of adhesive deposits 130 on lid material 120 to the relational alignment holes thereon for precisely positioning the adhesively-laminated lid material 110 for stamping, thermo-forming and cutting out of individual lids.

Advantageously, the arrangement of FIG. 4 also facilitates the mass production of lids with more complex adhesive patterns that address other requirements placed upon the lids to be formed therefrom. A further pattern of adhesive material 140 is deposited onto lid material 120 inside the area defined by the shape of adhesive material 130. Adhesive material 140 is, for example, a thermoplastic or thermosetting adhesive that is filled with thermally-conductive particles that with the finished lid will provide a path for thermal conduction from a device covered by the finished lid. Adhesive material 140 may be deposited to the same thickness as is adhesive 130, but is preferably thicker to ensure that it contacts and conforms to the device from which heat is to be removed. Preferably, lid material 120 is a thermally-conductive metal such as copper or aluminum. In such application, besides the adhesive bonding, additional thermal interface or adhesive will be useful if pre-applied onto such lid. The thermal interface provided by material 140 may be formed of a thermally-conductive adhesive having a reasonable bond strength or may simply be a thermal interface formed of a thermally-conductive material not having adhesive properties, such as a cured thermally-conductive thermosetting or thermoplastic material.

Figure 5:
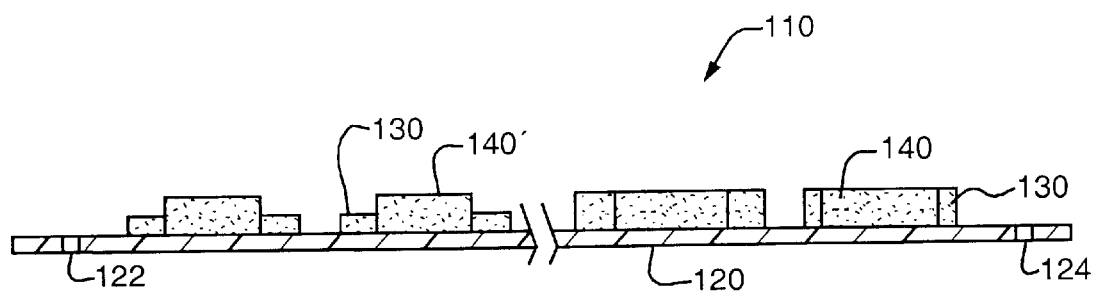
FIG. 5 is a cross-sectional view along the cross-sectional line I—I of the exemplary laminate of FIG. 4.

FIG. 5 is a cross-sectional view along the cross-sectional line I—I of the exemplary laminate 110 of FIG. 4. The pattern of the plurality of adhesive material 130 are on one surface of the sheet of lid material 110 in known positional relationship to relational alignment holes 122, 124. A pattern of thermally-conductive interface material 140 is deposited on the sheet of lid material 120 inside the areas defined by adhesive material 130 and have substantially the same thickness as does adhesive material 130. Thermally-conductive interface material 140' is similarly deposited on the sheet of lid material 120 inside the areas defined by adhesive material 130, but are substantially thicker than are the deposits of adhesive material 130, such as for more consistently making a given level of thermal contact with the top of the device to be covered by the lids 150 to be formed from laminate sheet 110.

Figure 6:
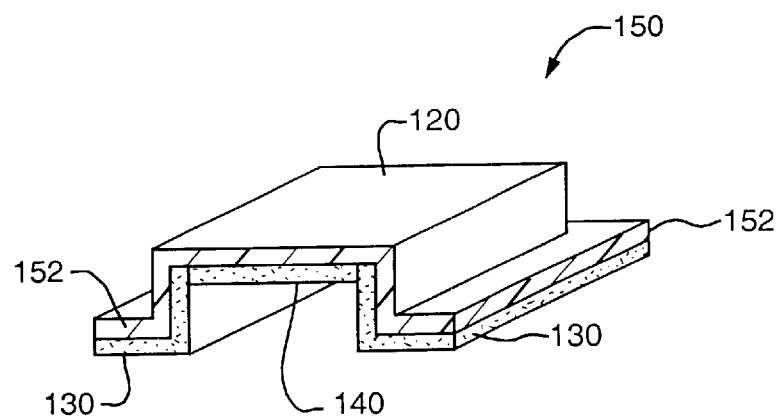
FIG. 6 is a cross-sectional view of one of the exemplary lids formed from the laminate of FIGS. 4 and 5.

FIG. 6 is a cross-sectional view of one of the exemplary lids 150 formed from the laminate 110 of FIGS. 4 and 5 by the forming or stamping and cutting operations described above in relation to FIGS. 2 and 3. The exterior of lid 150 is formed by the lid material 120 and the interior thereof is coated by the interface material 140 that was deposited onto the lid material 120 to form laminate 110. A bonding edge 152 of lid 150, which is of the same size and shape as is the deposit of adhesive material 130, has adhesive material 130 attached thereto. It is preferred that the sheet of lid material 120, the masks and/or screens employed to deposit adhesive 130 and material 140, and the tooling plates employed in the forming or stamping and the cutting operations to produce lids 150 each have two or more relational guide holes in the same known predetermined relationship to the patterns of adhesive 130 and material 140.

As a result, formed lids 150 and the method described above for producing formed lids 510 have great advantage in that a multiplicity of lids 150 having excellent uniformity and more complex adhesive and interface material pattens may be produced in a mass-production operation at low cost. This method eliminates the handling of individual lids and the application of individual adhesive preforms onto individual lids or the dispensing of adhesive onto individual lids, and also eliminates the dispensing of interface material or individual preforms thereof into individual lids, as in the prior art. Moreover, the adhesive on lids 150 is in solid form and tack free, thereby simplifying the handling of formed lids 150.

Figure 7:
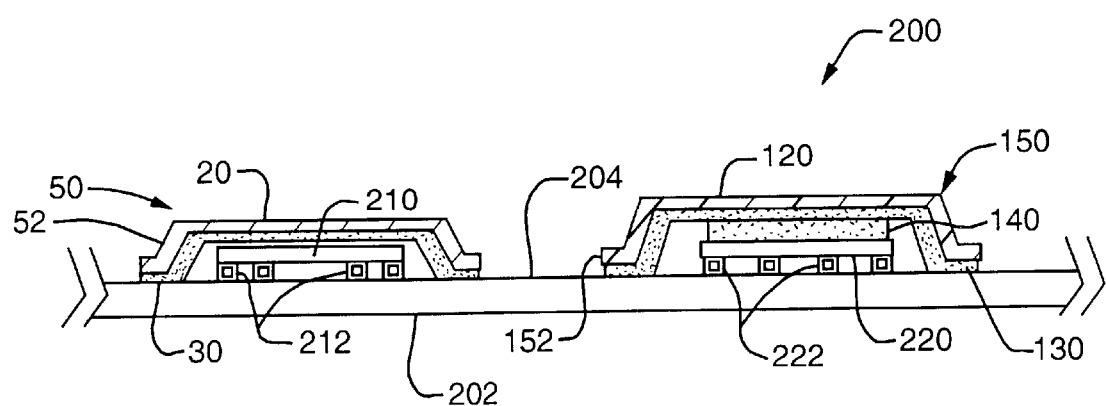
FIG. 7 is a cross-sectional view of an electronic device including exemplary ones of the lids of FIGS. 2 and 6 attached onto a circuit substrate.

FIG. 7 is a cross-sectional view of an electronic device 200 including exemplary ones of the laminated lids 50, 150 of FIGS. 2 and 6, respectively, attached onto a circuit substrate 202. Substrate 202 is a ceramic circuit substrate or a printed wiring circuit board, for example, having conductive circuit connections including contact pads at least on the top surface 204 thereof. Electronic devices 210 and 220, which may be, for example, microprocessors, memories or other integrated circuits, or may be resistors, capacitors, inductors, diodes, transistors or networks thereof, have contact pads on the surface thereof which is proximate top surface 204 of substrate 202, and are mounted to substrate 202 in a flip-chip manner. A plurality of electrical connections 212, 222 between the contact pads of electronic devices 210, 220, respectively, and the corresponding contact pads of substrate 202 are made by electrically-conductive adhesive, solder or other suitable material.

Laminated lid 50 covers and protects electronic device 210 and is attached by the bonding of adhesive material 30 between bonding edge 52 of lid 50 and surface 204 of substrate 202. In like manner, laminated lid 150 covers and protects electronic device 220 and is attached by the bonding of adhesive material 130 between bonding edge 152 of lid 150 and surface 204 of substrate 202. In addition, interface material 140 of lid 150 contacts the top of electronic device 220 and the lid material 120 of lid 150, for example, for providing a thermally-conductive path therebetween through which heat generated by electronic device 220 may be removed.

EXAMPLE 1

Lids are produced suitable for protecting microprocessor semiconductors that consume substantial power and are attached to a substrate in conventional flip-chip Ball-Grid-Array (BGA) format. Because of the high-power consumption of the microprocessor semiconductor, the backside of the semiconductor die must be linked thermally with the lid by a thermal interface material. A sheet laminate is formed of a 20-mil thick sheet of copper foil and a 6-mil thick film of thermally-conductive adhesive made of a thermosetting epoxy-based adhesive such as type ESP7258 or type ESP7458 which is available from AI Technology, Inc. located in Princeton, N.J., and which is filled with aluminum nitride thermally-conductive particles and exhibits a thermal conductivity of about 4.0 W/m-° C. or less. The laminate is formed by laminating the adhesive film of ESP7258 or ESP7458 epoxy adhesive and the copper foil using a heat laminator set to a temperature of about 130–150° C. The time of the heat lamination should be as short as possible, for example, in the range of several seconds, to prevent over B-staging the adhesive which would result in insufficient adhesive flow during the actual bonding of the lid to the substrate. The lids are produced by stamping this laminate to give the lids the proper lid shape and size, and the lids with the adhesive thereon are storable at ambient temperature for more than 12 months without loss of adhesive properties. The inside depth of the stamped lids is carefully engineered to have a depth dimension such that the adhesive film laminated inside the lids will directly contact the back-side of the high-power semiconductor flip-chip. During the process of bonding of the laminated lids over the semiconductor chip onto the substrate at a temperature of 150–175° C. for about 1–5 minutes, sufficient pressure is applied at the rim of the lid and to press the lid against the semiconductor chip, e.g., a pressure of about 10 psi on average, to achieve sufficient flow of the adhesive at the back-side of the semiconductor flip chip to assure intimate contact and good thermal transfer between the flip chip and the copper foil of the lid. It is noted that type ESP7258 or type ESP7458 epoxy adhesive has a strong bonding strength at temperatures below about 100° C., but advantageously has much lower bond strength above this temperature, thereby to allow easier removal of the lid for rework or repair of the electronic components and connections covered by the lid.

EXAMPLE 2

A laminate is prepared as in Example 1 using a 6-mil thick adhesive film of thermosetting epoxy adhesive such as type ESP7450-SC adhesive also available from AI Technology, Inc. In this example, the active part of the covered electronic device is not desired to be in contact with the adhesive film inside the laminated lid, and so the inside depth of the lid is not as critical so long as it is deeper than the height of the electronic component as mounted to the substrate inside the package. Adhesive type ESP7450-SC, which advantageously can be bonded at much faster rate than can conventional adhesives, is bonded at a temperature of 150° C. with a pressure of 5–10 psi for less than 5 minutes.

EXAMPLE 3

A liquid thermosetting thermally-conductive epoxy adhesive is laminated onto a 20-mil thick copper sheet using a wet lamination process. Type LESP7458 or type LESP7558 epoxy-based adhesive, which are the paste forms of type LESP7458 and type LESP7558 adhesives and are also available from AI Technology, is deposited to about a 9-mil thickness using a wet lamination process by pulling the copper sheet through a roller with one side of the copper sheet being filled with the wet paste adhesive. The wet adhesive paste on the copper foil sheet is then B-staged or dried in a box oven or in a belt oven at 60–80° C. until dry to the touch, typically about 5 minutes. The viscosity of the adhesive paste may be adjusted with suitable solvent such as methyl cyclohexane during the wet lamination process. After the adhesive is B-staged or dried, it is dry to the touch and may be stamped to produce lids, or it may be stored before stamping to produce lids. Storage may be for 12 months or more at ambient temperature without degradation of adhesive properties.

EXAMPLE 4

A laminate is formed of 3-mil thick adhesive and of 3-mil thick thermal interface material on a 30-mil thick sheet of copper. A first stencil patterned to produce lid-bonding adhesive preforms is positioned over the copper sheet using corresponding respective sets of relational alignment holes therein, and a pattern of adhesive shapes for the lids are deposited by stenciling type LESP7675 liquidous adhesive paste onto the substrate copper sheet. The wet adhesive paste is then B-staged at 60–80°C. until fully dry to the touch, typically about 30 minutes. A second stencil patterned to produce interface material preforms inside the areas defined by the lid-bonding adhesive preforms is positioned over the copper sheet using corresponding respective sets of relational alignment holes therein, and a pattern of shapes of interface material for the lids are deposited by stenciling type LCP7138 liquidous adhesive paste onto the substrate copper sheet. The wet interface material is then dried at 60–80° C. for sufficient time so that they are dry to the touch, typically about 30 minutes. Type LESP7675 liquid thermosetting epoxy adhesive and type LCP7138 thermoplastic thermally-conductive interface material are both available from AI Technology, Inc. The sheets of laminate of this combination of materials of the sort illustrated in FIG. 4 are then stamped into lids using the set of relational alignment holes on the copper sheet to align the laminate in the stamping machine that forms and cuts out the laminated lids of the sort illustrated in FIG. 6 from the laminate sheet. The depth of the lid is designed such that upon bonding of the lid to a substrate to cover an active device, and the flow of the lid bonding adhesive, intimate contact will be made between the covered active device and the thermal interface material, which exhibits a thermal conductivity of about 4.0 W/m-° C., so as provide a bridge for the thermal transfer of heat to the lid which then serves as a heat spreader. The lids with bonding adhesive and thermal interface material laminated thereto are then storable at ambient temperature for 12 months or more without degradation of adhesive properties. The lids are attached to the device substrate at a temperature of 150° C. for a time as short as 5 minutes with a pressure of 10 psi applied to the lid in the lid bonding area.

EXAMPLE 5

A 6-mil thick film of electrically-conductive thermoplastic adhesive, such as a film formed of type TP8150 adhesive also available from AI Technology, is hot laminated onto a 20-mil thick sheet of magnetic stainless steel at a temperature of 200° C. and a pressure of 10 psi instantly without curing. The laminate is stamped to produce lids that are electrically-conductive to provide EMI shielding of the devices they cover. Each lid may have one or more small openings in the top thereof produced in the stamping operation, which holes can be utilized for viewing the one or more devices that are covered thereby and for facilitating air flow to assist in cooling such device(s). Apertures of up to 100 mils may be employed without substantially degrading the EMI shielding effect at frequencies of up to 50 GHZ. In this example, the covered device is not in contact with the 6-mil thick adhesive layer inside the top of the lid, which layer exhibits a volume resistivity of about 0.1 ohm-cm or less. The lids are storable at ambient conditions for 12 months or more without degradation of adhesive properties. Attachment of the lids to a substrate to cover electronic devices attached to the substrate is performed at a temperature of 200° C. and with a pressure of 10 psi applied to the contact areas of the lids, for a time as short as one second. Faster bonding is achieved if the device substrate is preheated to 200° C. Lid bonds formed of type TP8150 adhesive exhibit strong bonding at temperatures below 150° C., but have no bond strength at temperatures above 200° C. which allows easier lid removal for rework or repair of the devices covered by the lid.

Laminated lids as described in Examples 4 and 5 have been fabricated and found to bond successfully to FR4 electronic substrate materials. Lids having dimensions in the range between 200 by 200 mils and 60 mils deep to 1000 by 1000 mils and 100 mils deep have been fabricated, however, lids of greater and lesser dimensions may be made using the present invention.

In each of the examples described above forming lids of the sort described in relation to FIGS. 4–6, the width of the adhesive preforms 130 is generally desired to be the same as the width of the lid bonding areas 152, i.e. widths in the range of about 10 to 100 mils. This desire is more important for laminating or attaching relatively narrow-width preforms (e.g., less than 100 mils wide) onto the lid material with sufficient bonding area before actual attachment of the lid onto the substrate of an electronic device. However, for lids having a wide bonding edge and therefore sufficient bonding area for secure lamination of the adhesive to the lid material, and particularly for lids including an electrically-conductive adhesive, it may be important to confine the area and volume of the electrically-adhesive preforms on the lids to reduce the likelihood of the adhesive contacting a conductor or component not desired. In some cases, it may be important for the adhesive preforms to be substantially displaced away from the edge of the lids to avoid potential electrical bridging to conductors and other contamination problems. It is noted that lids that have larger bonding areas to the substrate generally form more reliable bonds thereto.

While the lids formed by each of the examples above employed a metallic sheet lid material, thermo-formable polymeric sheets may also be employed. Some high temperature thermoplastics such as polyphenylene sulfide, polyesters, poly-ether sulfone, liquid crystal polymers and other suitable high temperature rigid polymers, and suitable thermosetting sheets such as poly prepreg sheets, may also be employed. In addition, the seals formed by the adhesives attaching the lids to the substrates form a barrier that is substantially impermeable to moisture, solvents, and other chemicals and contaminants.

In the examples where a sheet or film of adhesive is laminated to the sheet of lid material, the adhesive may be a pressure sensitive adhesive that is deposited, such as by roll coating, screen printing or other suitable method, onto a sheet of release liner material and B-staged sufficiently to leave it tacky so as to exhibit pressure sensitive adhesive properties. The tacky adhesive sheet is then laminated to the lid material and the release liner is removed.

Adhesive material 30, 130 and interface materials 140 are preferably filled with certain materials to tailor their characteristics to a particular application. Thermal conduction of the adhesive material may be increased by the addition of particles of a high-thermal conductivity material, such as alumina ($Al_2O_3$), aluminum nitride (AlN), boron nitride (BN), silicon carbide (SiC), or diamond, which fillers may also be employed to modify the coefficient of thermal expansion thereof. The coefficient of thermal expansion of the adhesive may also be reduced by the addition of particles of glass silicates, for example. In addition, polymeric crystallite and molecular crystallite materials may be added to improve the strength of the adhesive and its adhesion to certain substrate materials, and to adjust the modulus of elasticity and coefficient of thermal expansion of the adhesive.

It is noted that lids employing adhesives exhibiting strong bonding at lower temperatures, but having little or no bond strength at higher temperatures, allow easier lid removal for rework or repair of the devices covered by the lid. Similarly, adhesives that are more flexible, i.e. those having a lower coefficient of elasticity, tend to facilitate easier lid removal rework and repair. Flexible adhesives have a coefficient of elasticity of about 200,000 psi or less and typically exhibit an elongation of about 10% or more before fracture. A further advantage of certain lids made according to the present invention is that they provide electrically-conductive covers that are electrically connected to the device substrate, such as for providing EMI shielding, without the need for soldering and the risk of damage to electronic components and connections thereof posed by the high temperature required to melt and flow solder. The present invention is particularly advantageous in this regard because the very components and connections most likely to be damaged by the high soldering temperatures are those covered by the lids and therefore difficult or impossible to observe or inspect once the lid is in place.

For clarity it is noted that curing of an adhesive can refer to holding the adhesive at an elevated curing temperature for a period of time, as is the case for thermosetting adhesives, and to having the adhesive at a melt-flow temperature while in contact to the objects to be bonded and then reducing the temperature. The terms "lid" and "cover" are used interchangeably herein. It is further noted that the adhesive laminated to the lid may be referred to as a "preform" although it never existed apart from the lid material in its final shape. Bonding patterns of adhesive deposited onto a sheet of lid material may be referred to as a preform as may the adhesive laminated to the lid when it is cut out from the laminated sheet of lid material and adhesive.

While the present invention has been described in terms of the foregoing exemplary embodiments, variations within the scope and spirit of the present invention as defined by the claims following will be apparent to those skilled in the art. For example, the sheet of lid material 20, 120 may be an elongated strip of material that is fed from a roll to apparatus that continuously deposits adhesive 30, 130 thereon, passes the strip through an oven to dry or B-stage the adhesive thereby forming a laminated strip that then passes to apparatus that forms and cuts out individual lids row-by-row or section-by-section from such laminated strip.

Alternatively, the thermally-conductive or other material 140 deposited onto the laminate sheet 110 of FIG. 4 need not fill the area defined inside the shape of the adhesive 130. A material 140" is deposited having a size and shape selected, for example, to correspond to the size and shape of the top of the device that the lids formed from laminate sheet 110 will cover, and is deposited with a thickness sufficient to contact such device. Alternatively, the deposit of material 140" may have a size and shape selected to correspond to the size and shape of the top of the lids to be formed therefrom. Alternatively, material 140, 140', 140" may be electrically conductive and may be employed to make an electrical contact to the top of the device that the lids 150 formed from laminate sheet 110 will cover.

In addition, laminates of lid material and adhesive from which lids are formed include not only the sheets of metal and sheets of non-metallic material described above, but also laminates including two or more sheets of different metals, two or more sheets of different non-metallic materials, and two or more sheets of metallic and non-metallic materials together. For example, a laminate may include a thin metal foil, a thermo-formable plastic sheet material and a layer of adhesive.

Further, laminated lids according to the present invention may be attached to objects of any kind and not only to electronic and other substrates, and may be employed to cover objects other than electronic components, such as mechanical components and elements, holes and apertures, and any other object or space.

What is claimed is:

1. A method for making a plurality of laminated lids each having a bonding pattern of flexible adhesive laminated thereto comprising;

laminating a sheet of lid material and a flexible adhesive having a coefficient of elasticity of less than about 200,000 psi and an elongation of at least about 10% before fracture, wherein said laminating comprises depositing a pattern of the flexible adhesive including a plurality of bonding patterns on the sheet of lid material;

wherein said laminating further comprises depositing an interface material in a plurality of areas on the sheet of lid material defined by the plurality of bonding patterns; and then stamping said plurality of lids out of said laminated sheet of lid material and flexible adhesive, whereby plural lids each having a bonding pattern of flexible adhesive laminated thereto are made.

2. The method of claim 1 wherein said laminating comprises depositing a layer of the flexible adhesive on the sheet of lid material.

3. The method of claim 2 wherein said depositing includes a method selected from the group consisting of roll coating, drum coating, stenciling, screening, mesh screening, contact screening, printing, ink-jet printing, and sheet laminating.

4. The method of claim 1 wherein said depositing includes a method selected from the group consisting of roll coating, drum coating, stenciling, screening, mesh screening, contact screening, printing, ink-jet printing, and sheet laminating.

5. The method of claim 1 wherein said laminating includes depositing a flexible adhesive selected from the group consisting of electrically-insulating thermoplastic adhesives, electrically-conductive thermoplastic adhesives, thermally-conductive thermoplastic adhesives, electrically-insulating thermosetting adhesives, electrically-conductive thermosetting adhesives, thermally-conductive thermosetting adhesives, and combinations thereof.

6. The method of claim 1 wherein said laminating further includes one of drying and B-staging the flexible adhesive laminated to the sheet of lid material.

7. The method of claim 1 where said laminating includes selecting the lid material from the group consisting of sheets, foils and films=s of thermo-formable plastic, liquid crystal polymer, polyester, poly-ether sulfone, polyphenylene sulfide, copper; aluminum, brass, steel, stainless steel and alloys thereof, and combinations thereof.

8. The method of claim 1 wherein said stamping includes locating the laminated sheet between first and second tooling plates, the first tooling plate having a plurality of recesses therein, and the second tooling plate having a plurality of projections therefrom in positions corresponding to the recesses in the first tooling plate.

9. The method of claim 8 further comprising forming the plurality of laminated lids in the laminated sheet by moving the first and second tooling plates together to place the projections of the second tooling plate into the recesses of the first tooling plate, whereby the laminated sheet is formed into the recesses by the projections.

10. The method of claim 9 further comprising cutting the plurality of formed laminated lids from the formed laminate sheet.

11. The method of claim 8 wherein said locating the laminated sheet includes aligning at least two relational alignment holes in each of the tooling plates with corresponding relational alignment holes in the laminated sheet, the relational alignment holes being in known predetermined positional relationship with the pluralities of projections and recesses.

12. The method of claim 1 wherein said stamping includes:

locating the laminated sheet between first and second tooling plates, the first tooling plate having a plurality of recesses therein in positions corresponding to the plurality of bonding patterns of flexible adhesive, and the second tooling plate having a plurality of projections therefrom in positions corresponding to the recesses in the first tooling plate; and aligning at least two relational alignment holes in each of the tooling plates with corresponding relational alignment holes in the laminated sheet, the relational alignment holes being in known predetermined positional relationship with the pattern of the plurality of bonding patterns of flexible adhesive.

13. The method of claim 1 further comprising placing at least one of said laminated lids on a substrate with the flexible adhesive contacting the substrate, and curing said flexible adhesive to bond said at least one of said laminated lids to said substrate.

14. The method of claim 13 wherein said placing at least one of said laminated lids includes applying sufficient heat and pressure to cause the flexible adhesive to flow.

15. The method of claim 1 wherein said laminating a sheet of lid material and a flexible adhesive comprises:

placing a sheet of flexible adhesive adjacent the sheet of lid material, and heat laminating the sheet of flexible adhesive and the sheet of lid material.

16. A method for contemporaneously making a plurality of lids having a bonding pattern of flexible adhesive laminated thereto comprising:

obtain a sheet of lid material;

depositing a layer of flexible adhesive having a coefficient of elasticity of less than about 200,000 psi and an elongation of at least about 10% before fracture on the sheet of lid material to form a laminated sheet of lid material and flexible adhesive;

wherein said depositing a layer of flexible adhesive comprises depositing a pattern of the flexible adhesive including a plurality of bonding patterns on the sheet of lid material;

wherein said depositing a layer of flexible adhesive further comprises depositing an interface material in a plurality of areas on the sheet of lid material defined by the plurality of bonding patterns;

then locating laminated sheet between first and second tooling plates, the first tooling plate having a plurality of recesses therein at positions corresponding to the plurality of lids to be formed, and the second tooling plate having a plurality of projections therefrom in positions corresponding to the recesses in the first tooling plate;

then forming the plurality of lids in the laminated sheet by moving the tooling plates together to place the projections of the second tooling plate into the recesses of the first tooling plate, whereby the laminated sheet is formed into the recesses by the projections; and then cutting the plurality of formed lids from the formed laminate sheet, whereby a plurality of lids having a bonding pattern of flexible adhesive laminated thereto are contemporaneously made.

17. The method of claim 16 wherein said depositing a layer of flexible adhesive includes a method selected from the group consisting of roll coating, drum coating, stenciling, screening, mesh screening, contact screening, printing, ink-jet printing and sheet laminating.

18. The method of claim 16 wherein said depositing a layer of flexible adhesive includes depositing a flexible adhesive selected from the group consisting of electrically-insulating thermoplastic adhesives, electrically-conductive thermoplastic adhesives, thermally-conductive thermoplastic adhesives, electrically-insulating thermosetting adhesives, electrically-conductive setting adhesives, thermally-conductive thermosetting adhesives, and combinations thereof.

19. The method of claim 16 further including one of drying and B-staging the flexible adhesive deposited on the sheet of lid material.

20. The method of claim 16 where said obtaining a sheet of lid material includes selecting the lid material from the group consisting of sheets, foils and films of thermoformable plastic, liquid crystal polymer, polyester, polyether sulfone, polyphenylene sulfide, copper, aluminum, brass, steel, stainless steel and alloys thereof, and combinations thereof.

21. The method of claim 16 wherein said locating the laminated sheet includes aligning a set of at least two relational alignment holes in each of the tooling plates with a corresponding set of relational alignment holes in the laminated sheet, each set of relational alignment holes being in like predetermined positional relationship with the pluralities of projections and recesses in the tooling plates.

22. The method of claim 16 wherein said locating the laminated sheet between fist and second tooling plates includes the first tooling plate having a plurality of recesses therein in positions corresponding to the plurality of bonding patterns of flexible adhesive; and further including
aligning sets of at least two relational alignment boles in each of the tooling plates with a corresponding set of relational alignment holes in the laminated sheet, each set of relational alignment holes being in like predetermined positional relationship with the pattern of the plurality of bonding patterns of flexible adhesive.

23. The method of claim 16 further comprising placing at least one of said located lids on a substrate with the flexible adhesive contacting the substrate, and curing said flexible adhesive to bond said at least one of said laminated lids to said substrate.

24. The method of claim 23 wherein said placing at least one of said laminated lids includes applying sufficient heat and pressure to cause the flexible adhesive to flow.

25. The method of claim 16 wherein said flexible adhesive includes particulates for modifying at least one of the electrical conductivity, thermal conductivity, and coefficient of the expansion of the flexible adhesive.

26. The method of claim 16 wherein said depositing a layer of flexible adhesive to form a laminated sheet of lid material and flexible adhesive comprises;
placing a sheet of the flexible adhesive adjacent the sheet of lid material, and
heat laminating the sheet of flexible adhesive and the sheet of lid material.

27. A method for making a plurality of stamped lids comprising:
providing a sheet of lid material;
applying a layer of a flexible adhesive defining a plurality of bonding patterns on the sheet of lid material,
wherein flexible adhesive has a coefficient of elasticity of less than about 200,000 psi and an elongation of at least about 10% before fracture, and
wherein e flexible adhesive has a melt-flow temperature at which the bond strength of the flexible adhesive is substantially reduced;
depositing an interface material in a plurality of areas defined by the plurality of bonding patterns; and
then stamping said plurality of stamped lids out of the sheet of lid material having flexible adhesive thereon,
whereby each stamped lid includes a flexible adhesive bonding pattern removable at the melt-flow temperature.

28. The method of claim 27 further comprising:
heating at least the flexible adhesive to at least the melt-flow temperature, and
pressing the heated flexible adhesive against a substrate to attach the stamped lid to the substrate.

29. The method of claim 28 further comprising:
heating at least the flexible adhesive attaching the stamped lid to the substrate to at least the melt-flow temperature, thereby to reduce the bond strength of the flexible adhesive, and
then removing the stamped lid from the substrate.

* * * * *